United States Patent
Ebeling

(10) Patent No.: US 6,445,010 B1
(45) Date of Patent: Sep. 3, 2002

(54) OPTOELECTRONIC COMPONENT EMITTING INCOHERENT RADIATION

(75) Inventor: Karl Joachim Ebeling, Ulm (DE)

(73) Assignee: Osram Opto Semiconductors GmbH & Co. OHG, Regensburg (DE)

(*) Notice: Subject to any disclaimer, the term of this patent is extended or adjusted under 35 U.S.C. 154(b) by 0 days.

(21) Appl. No.: 09/472,220

(22) Filed: Dec. 27, 1999

Related U.S. Application Data

(63) Continuation of application No. PCT/DE98/01749, filed on Jun. 26, 1998.

(30) Foreign Application Priority Data

Jun. 26, 1997 (DE) .......................................... 197 27 233

(51) Int. Cl.[7] .............................................. H01L 33/00
(52) U.S. Cl. .......................... 257/94; 257/96; 257/103
(58) Field of Search ............................. 438/22, 43, 29; 257/98, 103, 94, 96; 372/45, 46; 385/131, 14

(56) References Cited

U.S. PATENT DOCUMENTS

| | | | |
|---|---|---|---|
| 3,900,863 A | | 8/1975 | Kim |
| 4,276,098 A | | 6/1981 | Nelson et al. |
| 5,386,429 A | * | 1/1995 | Naito et al. |
| 5,408,486 A | * | 4/1995 | Shoji ........................... 372/45 |
| 5,488,678 A | * | 1/1996 | Taneya et al. ................. 385/14 |
| 6,118,801 A | * | 9/2000 | Ishikawa et al. .............. 372/46 |
| 6,229,160 B1 | * | 5/2001 | Krames et al. |

FOREIGN PATENT DOCUMENTS

| | | |
|---|---|---|
| EP | 0 405 757 A2 | 1/1991 |
| EP | 0 558 089 A2 | 9/1993 |
| EP | 0 582 078 A1 | 2/1994 |
| FR | 2 649 537 | 1/1991 |
| GB | 2 072 946 | 10/1981 |
| JP | 63-27072 | 2/1988 |

OTHER PUBLICATIONS

"Superluminescent Diodes with Angled Facet Etched by Chemically Assisted Ion Beam Etching", Electronics Letters, May 23, 1991, vol. 27, No. 11, pp. 968–70.

"Halbleiter–Optoelektronik" (Bludau), Hanser Verlag 1995, München, Wien, pp. 92–114 and 182–187; (Semiconductor Optoelectronics).

Patent Abstracts of Japan No. 04–078174 (Katsutoshi), dated Mar. 12, 1992.

Patent Abstracts of Japan No. 63–073572 (Toshio), dated Apr. 4, 1988.

* cited by examiner

Primary Examiner—Caridad Everhart
(74) Attorney, Agent, or Firm—Laurence A. Greenberg; Werner H. Stemer; Ralph E. Locher

(57) ABSTRACT

The radiation emitting optoelectronic component has a radiation generating body with a planar optical waveguide and a wave guiding layer. The wave guiding layer has a radiation generating zone in which electromagnetic radiation is generated while the component is operating. The planar optical waveguide has at least one lateral output taper for outputting the radiation from the waveguide.

25 Claims, 2 Drawing Sheets

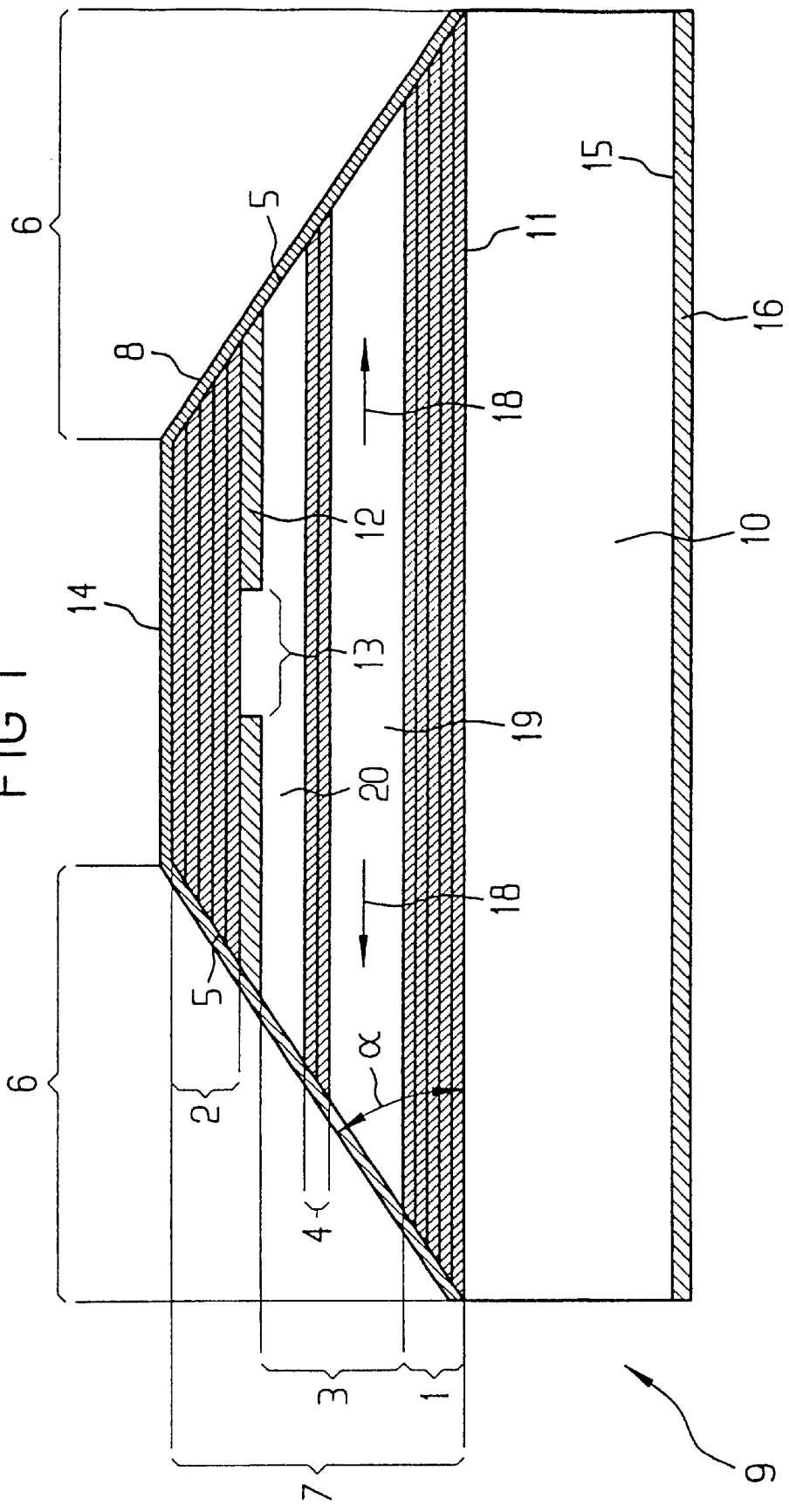

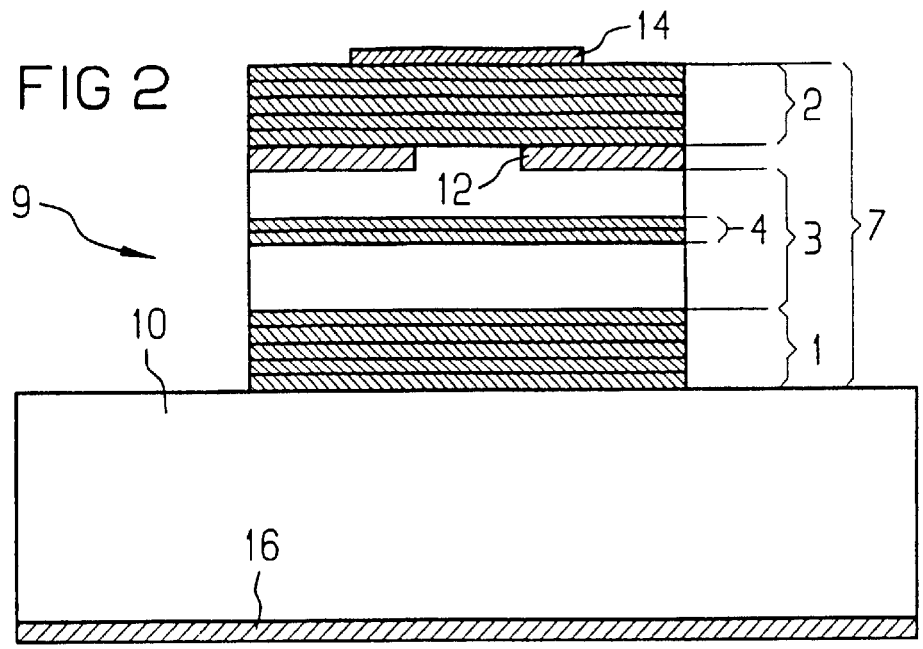
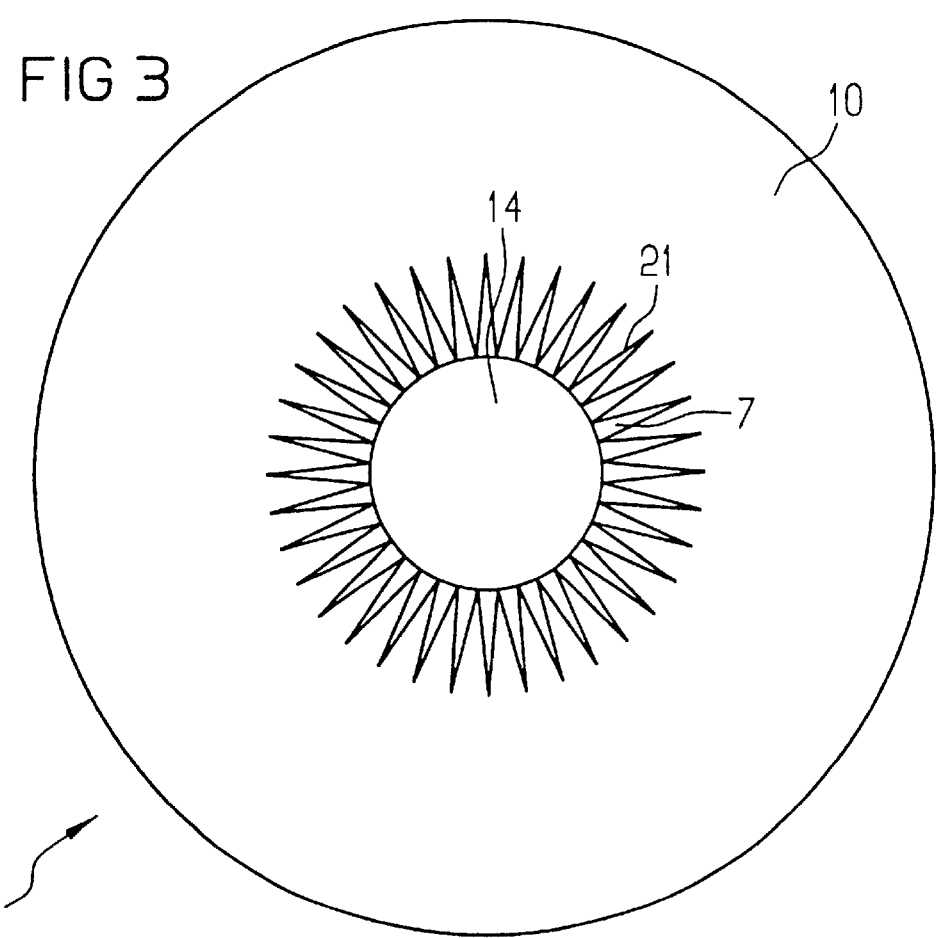

OPTOELECTRONIC COMPONENT EMITTING INCOHERENT RADIATION

CROSS-REFERENCE TO RELATED APPLICATION

This is a continuation of copending International Application PCT/DE98/01749, filed Jun. 26, 1998, which designated the United States.

BACKGROUND OF THE INVENTION

FIELD OF THE INVENTION

The invention concerns an optoelectronic component that emits incoherent radiation. In particular, the invention pertains to semiconductor light emitting diodes.

A variety of principles are known for the construction of semiconductor light emitting diodes (LEDs and IREDs), for example, from W. Bludau, Halbleiter-Optoelektronik [Semiconductor Optoelectronics], Munich, Vienna, Hanser-Verlag 1995, pages 92 to 114. The LEDs described therein are, for example, fabricated on the basis of GaP, GaAsP, GaAs, GaAlAs, InGaAsP and InGaN semiconductor material.

A central problem associated with prior art light emitting diodes is the efficient radiation output from the semiconductor body producing the radiation. This takes place either through the front face or through the side faces of the semiconductor body. Some light emitting diodes contain special additional layers for distributing the radiation in order to suppress the total reflection at the outer surfaces of the semiconductor body. As before, however, the external quantum yield of these components is comparatively low.

SUMMARY OF THE INVENTION

It is accordingly an object of the invention to provide an incoherent radiation emitting optoelectronic component, which overcomes the above-mentioned disadvantages of the heretoforeknown devices and methods of this general type and which has a higher external quantum yield compared with prior art light emitting diodes.

With the foregoing and other objects in view there is provided, in accordance with the invention, an incoherent radiation-emitting optoelectronic component, comprising:

a radiation generating body formed with a planar optical waveguide having a wave guiding layer arranged between two reflecting layers, the planar optical waveguide defining a direction of wave propagation;

a radiation generating zone formed in the wave guiding layer for generating electromagnetic radiation;

a device formed in the radiation generating body for lateral current pinching in the radiation generating body; and the wave guiding layer having an outer side face enclosing a given angle with the direction of wave propagation in the planar optical waveguide.

In accordance with an added feature of the invention, the radiation generating body is a semiconductor body.

In other words, in accordance with the invention, a radiation generating body is provided with a planar optical waveguide with a wave guiding layer, and the wave guiding layer has a radiation generating zone. The zone generates an electromagnetic radiation while the component is operating. The planar optical waveguide has at least one lateral output taper over which the radiation generated in the radiation generating zone while the component is operating is output as space radiation from the wave guide into the surroundings of the radiation generating body.

The term "output taper" means quite generally a slanting outer side face of the wave guiding layer of the waveguide, i.e. a side face which is positioned neither parallel nor perpendicular to a direction of wave propagation in the planar optical waveguide. Preferably, the entire side face of the planar optical waveguide is formed as an output taper. These outer areas of the wave guiding layer therefore function as a taper for the photons propagated in the wave guiding layer.

The structure, according to the invention, of the radiation generating body forces the photons emitted by the radiation generating zone into the wave guiding region—the wave guiding layer—of the planar optical waveguide. The radiation generating zone and the planar optical waveguide are preferably constructed such as to support principally the emission of TE waves and emission in the lateral direction of the planar optical waveguide.

As a result, the electromagnetic radiation generated advantageously strikes the lateral output taper at a defined angle.

In accordance with an additional feature of the invention, the outer side face of the wave guiding layer and side faces of the two reflector layers jointly form a side face oriented at an angle relative to the wave propagating layer.

In accordance with another feature of the invention, each of the two reflecting layers is a Bragg reflector.

In these further preferred embodiments of the radiation emitting optoelectronic component according to the invention, the wave guiding layer is arranged between two highly reflective plane-parallel optical reflecting layers which in the case of a radiation emitting semiconductor body are preferably formed as Bragg reflectors. Such structures are known, e.g. from laser diodes with vertical resonators, where epitaxial Bragg mirrors are mainly used as resonating mirrors (cf. W. Bludau, supra, pages 188–89).

A considerable advantage of this embodiment consists therein that the radiation generating zone, e.g. a radiation generating p-n junction, is positioned between two highly reflective plane-parallel mirrors, which form a low loss planar optical waveguide. This leads to an advantageous significant reduction of optical losses within the waveguide. As an example, epitaxial Bragg mirrors enable reflection factors of over 99% to be realized routinely. Appropriate selection of the thickness of the waveguide also allow the absorption losses within the waveguide to be considerably reduced.

In accordance with again an added feature of the invention, the radiation generating body is a semiconductor body and the radiation generating zone has a single or multiple quantum well structure. Quantum well structures of this kind are, in fact, known in the field of optical semiconductor technology (cf. W. Bludau, supra, pages 18–87).

In accordance with again an additional feature of the invention, the single or multiple quantum well structure is fabricated from compressively strained quantum wells. Such compressively strained quantum wells optimally couple with the TE modes of the planar waveguide formed by the two reflecting layers, preferably Bragg reflectors. The quantum wells are preferably arranged near the node of a standing-wave field formed vertically to the direction of wave propagation of the planar optical waveguide while the component is operating. As a result electromagnetic radiation generated in the radiation generating zone is favored advantageously in the lateral direction, i.e. parallel to the waveguide.

In accordance with again a further feature of the invention, therefore, the optical waveguide is a vertical lateral output taper. Alternatively, the optical waveguide is a horizontal lateral output taper.

In a further preferred embodiment of the component according to the invention the radiation generating body has an essentially cylindrically symmetrical shape whereby the axis of symmetry runs essentially perpendicular to the planar optical waveguide. The radiation generating zone is preferably arranged in such a way that the photons are generated near the axis of the cylindrically symmetrical structure.

As a result of the output taper the radiation modes running outwards in the waveguide are converted into space waves almost without losses and thus effect an optimal light output from the radiation generating body.

In a further especially preferred embodiment the output taper preferably includes an angle of approximately 1° to 30° with the direction of propagation of the radiation in the planar optical waveguide. In order to further improve the output of the electromagnetic radiation through the output taper this is advantageously provided with an anti-reflection layer.

In addition, in a further advantageous embodiment the entire side face of the planar optical waveguide is formed as an output taper.

Radiation generating bodies according to the invention can advantageously be incorporated in LED cases of prior art, e.g. radial LED cases, SMD cases for laterally or upwardly emitting LEDs or SOT cases, in which they are cast en bloc in synthetic material. However, any other kind of LED case is also conceivable.

Other features which are considered as characteristic for the invention are set forth in the appended claims.

Although the invention is illustrated and described herein as embodied in an incoherent Radiation Emitting Optoelectronic Component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic illustration of a vertical sectional view of an exemplary embodiment according to the invention;

FIG. 2 is a schematic illustration of a top view of a further exemplary embodiment; and FIG. 3 is a schematic illustration of a side view of the exemplary embodiment of FIG. 2.

Structurally and functionally equivalent components are identified with the same reference numbers throughout the figures.

DESCRIPTION OF THE PREFERRED EMBODIMENTS

Referring now to the figures of the drawing in detail and first, particularly, to FIG. 1 thereof, there is seen a vertically tapered LED in which a first Bragg reflector layer 1, formed, for instance, of around 20 approximately 150 nm thick n-doped AlAs-GaAs layer pairs, is disposed on a first main surface 11 of a substrate 10. The substrate in the exemplary embodiment may be n-doped GaAs. Bragg reflectors of this kind, their functional principle and the method of their fabrication are known in the field of optical semiconductor technology and will therefore not be discussed further.

A wave guiding layer 3 is arranged on the first Bragg reflector layer 1. The wave guiding layer 3 consists of n-doped AlGaAs (for example, $Al_{0.2}Ga_{0.8}As$ with $n \approx 5 \times 10^{17}$ $cm^{-3}$) in the lower part 19 facing towards the first Bragg reflector layer 1 and consists of p-doped AlGaAs (for example, $Al_{0.2}Ga_{0.8}As$ with $n \approx 5 \times 10^{17}$ $cm^{-3}$) in the upper part 20 facing away from the first Bragg reflector layer 1. The exemplary wave guiding layer 3 is approximately 3 mm thick. Between the upper part 20 and the lower part 19 of the wave guiding layer 3 there is located a non-doped recombination zone 4 which is formed of three approximately 8 nm thick $In_{0.2}Ga_{0.8}As$ quantum wells with approximately 10 nm thick GaAs barriers.

A second Bragg reflector layer 2 is arranged above the wave guiding layer 3. The Bragg reflector layer 2 may be fabricated from approx. 20 mirror pairs consisting of p-doped $Al_{0.9}Ga_{0.1}As$/GaAs layer pairs. The lowest layer—i.e. the layer next to the wave guiding layer 3—is an approximately 30 nm thick $Al_xGa_{1-x}As$ layer ($0.97 \leq x \leq 1$) for lateral oxidation to an $Al_xO_y$ layer. The lowest layer of the p-doped Bragg reflector 2 is not oxidized to $Al_xO_Y$ over its entire surface but has a non-oxidized zone 13 in the central region. While the component is operating this partly oxidized AlGaAs layer 12 causes a lateral pinching of the current in the semiconductor body 9. This can also be achieved, however, through making specific regions of the semiconductor body 9 electrically conducting or electrically insulating by means of ion implantation or lateral injection.

The topmost layer of the second Bragg reflector layer 2—i.e. the layer furthest from the wave guiding layer 3—is a highly p-doped GaAs contact layer to which a TiPtAu contact 14 is attached. A second electrical contact 16, an n-contact, e.g. consisting of AuGeNi, is attached to the entire surface of the second main surface 15 of the substrate 10. The second main surface 15 lies opposite to the first main surface 11.

The two Bragg reflector layers 1,2 are, for example, modulation doped through a method of prior art in order to achieve low-impedance coupling of the internal pn-junction of the radiation generating zone 4 to the external electrical contacts 14,16 and possess graded hetero-junctions.

The side faces 5 of the wave guiding layer 3 together with the Bragg reflector layers 1,2 are polished to slope at an angle α to the mirror surfaces of the Bragg reflector layers 1,2 and thus to the planar optical waveguide 7 consisting of the first and the second Bragg reflector layer 1,2 and the wave guiding layer 3. They thus function as vertical lateral output tapers for the photons propagating outwards in the wave guiding layer in the direction 18 of radiation propagation. The angle α preferably lies approximately between 1° and 30°. An anti-reflection layer 8 is applied to the sloping side faces 5.

As an alternative to the vertical lateral taper structure according to the exemplary embodiment of FIG. 1 it is also possible to use horizontal lateral taper structures. An exemplary embodiment of this is illustrated in FIGS. 2 and 3 in a top view and a side view, respectively. The sequence of layers in this is identical to that of the exemplary embodiment of FIG. 1.

In the second embodiment, however, the side face 5 of the wave guiding layer 3 and the two mirror layers are not formed at an angle to the Bragg reflector layers 1,2. Instead, the waveguide 7 has wedge-shaped indentations 21 standing perpendicularly to the Bragg reflector layers 1,2 and running from the side face towards the center of the semiconductor body 9. The angle enclosed by the indentations 21 can be, for example, up to 20° and the lateral wedge depth of the indentations 21 can be up to 100 μm. In this case as well, the side faces of the waveguide 7 can be provided with an anti-reflection layer 8.

The characteristic diameter of the components lies between 100 and 300 μm. The diameter of the p-contact lies between 50 and 100 μm and that of the taper region varies between 25 and 100 μm. The thickness of the planar optical waveguide can be used to set the residual absorption which decreases with the square of the thickness of the layer. For the example presented the thickness of each of the Bragg mirrors is approximately 3 μm.

The sequence of layers described can be fabricated, for example, using molecular beam epitaxy. Carbon, for example, can be used for p-doping and silicon for n-doping. Fabrication is also possible, for example, using organometallic gas phase epitaxy. The taper structures can be realized, for example, through dry etching. The lateral oxidation of the $Al_xGa_{1-x}As$ layer can be carried out in water steam at approximately 400° C.

As described above it is possible to use not only star-shaped horizontal lateral output tapers or simple wedge-shaped vertical lateral output tapers, but also any other shape suitable for an output taper.

Clearly, structural shapes other than those of the embodiments outlined are also possible, for example geometries which do not possess cylindrical symmetry. Alternative embodiments of the mirrors, e.g. through metallic layers, can be used. Moreover, other means of current pinching, e.g. through ion implantation or reverse prebiased pn-diodes, can be used. The structure is also not restricted to the material system described in the exemplary embodiments but can also be realized, for example, in the material systems InAlGaP on GaAs substrate or InGaAsP on InP substrate or InAlGaN on SiC or sapphire substrate. Furthermore, the proposed structures can also be realized in II-VI semiconductor systems or organic light-emitting components.

I claim:

1. An incoherent radiation-emitting optoelectronic component, comprising:
    a radiation generating body formed with a planar optical waveguide having a wave guiding layer arranged between two reflecting layers, said planar optical waveguide defining a direction of wave propagation;
    a radiation generating zone formed in said wave guiding layer for generating electromagnetic radiation;
    a device formed in said radiation generating body for lateral current pinching in said radiation generating body; and
    said wave guiding layer having an outer side face enclosing a given angle with the direction of wave propagation in said planar optical waveguide.

2. The optoelectronic component according to claim 1, wherein said radiation generating body is a semiconductor body.

3. The optoelectronic component according to claim 1, wherein said outer side face of said wave guiding layer and side faces of said two reflector layers jointly form a side face oriented at an angle relative to the direction of wave propagation.

4. The optoelectronic component according to claim 1, wherein each of said two reflecting layers is a Bragg reflector.

5. The optoelectronic component according to claim 1, wherein said outer side face encloses an angle of between 1° and 30° with the direction of wave propagation in said planar optical waveguide.

6. The optoelectronic component according to claim 1, wherein said radiation generating body is a semiconductor body and said radiation generating zone has a single quantum well structure.

7. The optoelectronic component according to claim 6, wherein said single quantum well structure is fabricated from compressively strained quantum wells.

8. The optoelectronic component according to claim 7, wherein said quantum wells are arranged in vicinity of a node of a standing wave field formed in a vertical direction to said waveguide while the component is operating.

9. The optoelectronic component according to claim 1, wherein said radiation generating body is a semiconductor body and said radiation generating zone has a multiple quantum well structure.

10. The optoelectronic component according to claim 9, wherein said multiple quantum well structure is fabricated from compressively strained quantum wells.

11. The optoelectronic component according to claim 10, wherein said quantum wells are arranged in vicinity of a node of a standing wave field formed in a vertical direction to said waveguide while the component is operating.

12. The optoelectronic component according to claim 1, wherein said optical waveguide is a vertical lateral output taper.

13. The optoelectronic component according to claim 1, which comprises an antireflection layer on at least said outer side face.

14. An incoherent radiation-emitting optoelectronic component, comprising:
    a radiation generating body formed with a planar optical waveguide having a wave guiding layer arranged between two reflecting layers forming a horizontal lateral output taper, said planar optical waveguide defining a direction of wave propagation;
    a radiation generating zone formed in said wave guiding layer for generating electromagnetic radiation;
    a device formed in said radiation generating body for lateral current pinching in said radiation generating body; and
    said wave guiding layer having an outer side face enclosing a given angle with the direction of wave propagation in said planar optical waveguide.

15. The optoelectronic component according to claim 14, wherein said radiation generating body is a semiconductor body.

16. The optoelectronic component according to claim 14, wherein said outer side face of said wave guiding layer and side faces of said two reflector layers jointly form a side face oriented at an angle relative to said wave propagating layer.

17. The optoelectronic component according to claim 14, wherein each of said two reflecting layers is a Bragg reflector.

18. The optoelectronic component according to claim 14, wherein said outer side face encloses an angle of between 1° and 30° with the direction of wave propagation in said planar optical waveguide.

19. The optoelectronic component according to claim 14, wherein said radiation generating body is a semiconductor body and said radiation generating zone has a single quantum well structure.

20. The optoelectronic component according to claim 19, wherein said single quantum well structure is fabricated from compressively strained quantum wells.

21. The optoelectronic component according to claim 20, wherein said quantum wells are arranged in vicinity of a node of a standing wave field formed in a vertical direction to said waveguide while the component is operating.

22. The optoelectronic component according to claim 14, wherein said radiation generating body is a semiconductor body and said radiation generating zone has a multiple quantum well structure.

23. The optoelectronic component according to claim 22, wherein said multiple quantum well structure is fabricated from compressively strained quantum wells.

24. The optoelectronic component according to claim 23, wherein said quantum wells are arranged in vicinity of a node of a standing wave field formed in a vertical direction to said waveguide while the component is operating.

25. The optoelectronic component according to claim 14, which comprises an antireflection layer on at least said outer side face.

* * * * *